United States Patent
Gong et al.

(10) Patent No.: US 11,937,482 B2
(45) Date of Patent: Mar. 19, 2024

(54) DISPLAY PANEL WITH COLOR ORGANIC LIGHT-TRANSMISSIVE THIN FILMS AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Wenliang Gong, Wuhan (CN); Wenxu Xianyu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 902 days.

(21) Appl. No.: 16/966,040

(22) PCT Filed: Jun. 5, 2020

(86) PCT No.: PCT/CN2020/094581
§ 371 (c)(1),
(2) Date: Jul. 30, 2020

(87) PCT Pub. No.: WO2021/196400
PCT Pub. Date: Oct. 7, 2021

(65) Prior Publication Data
US 2023/0157118 A1    May 18, 2023

(30) Foreign Application Priority Data
Apr. 2, 2020    (CN) .......................... 202010256293.5

(51) Int. Cl.
*H10K 59/38* (2023.01)
*H10K 59/12* (2023.01)
(Continued)

(52) U.S. Cl.
CPC ......... *H10K 59/38* (2023.02); *H10K 59/1201* (2023.02); *H10K 59/353* (2023.02);
(Continued)

(58) Field of Classification Search
CPC .. H10K 59/38; H10K 59/1201; H10K 59/353; H10K 59/873; H10K 59/8792;
(Continued)

(56) References Cited

U.S. PATENT DOCUMENTS 10,131,129 B2 * 11/2018 Chiang ..................... B32B 7/12
10,748,777 B2 * 8/2020 Eom ..................... G02F 1/1345
(Continued)

FOREIGN PATENT DOCUMENTS

CN        103378124 A    10/2013
CN        106164713 A    11/2016
(Continued)

*Primary Examiner* — Caleb E Henry
(74) *Attorney, Agent, or Firm* — PV IP PC; Wei Te Chung; Zhigang Ma

(57) ABSTRACT

A display panel and a manufacturing method thereof are disclosed. The display panel includes a display device and an anti-reflective layer disposed on the display device. The display device includes a plurality of sub-pixel areas distributed in an array manner. The anti-reflected layer includes a plurality of organic light-transmissive thin films corresponding to the sub-pixel areas. A plurality of inorganic nanoparticles are doped in the organic light-transmissive thin films. The inorganic nanoparticles at a side of the organic light-transmissive thin films away from the display device protrude from a surface of the organic light-transmissive thin films to form a plurality of nano moth-eye structures.

20 Claims, 3 Drawing Sheets

(51) Int. Cl.
  *H10K 59/35*   (2023.01)
  *H10K 59/80*   (2023.01)
  *H10K 71/13*   (2023.01)
  *H10K 102/00*  (2023.01)

(52) U.S. Cl.
  CPC ....... *H10K 59/873* (2023.02); *H10K 59/8792* (2023.02); *H10K 71/135* (2023.02); *H10K 2102/331* (2023.02)

(58) Field of Classification Search
  CPC ........... H10K 71/135; H10K 2102/331; H10K 59/8791; H10K 59/12; H10K 59/352; H10K 59/35; H10K 50/86; H10K 50/865; B82Y 30/00; B82Y 40/00; H01L 25/0753; H01L 33/44; H01L 2933/0025; H01L 27/156
  See application file for complete search history.

(56) References Cited

U.S. PATENT DOCUMENTS

| | | | | |
|---|---|---|---|---|
| 2016/0303838 | A1* | 10/2016 | Chen | B32B 27/06 |
| 2018/0050959 | A1* | 2/2018 | Dirks | C23C 16/0245 |
| 2018/0237291 | A1* | 8/2018 | Diao | H01L 31/00 |
| 2018/0269428 | A1* | 9/2018 | Uchida | H10K 50/852 |
| 2019/0187336 | A1* | 6/2019 | Masuda | G02B 1/14 |

FOREIGN PATENT DOCUMENTS

| | | |
|---|---|---|
| CN | 109494239 A | 3/2019 |
| CN | 109494309 A | 3/2019 |
| CN | 109642963 A | 4/2019 |
| CN | 110002768 A | 7/2019 |
| CN | 110112227 A | 8/2019 |
| CN | 110350003 A | 10/2019 |
| JP | 2009139796 A | 6/2009 |

* cited by examiner

DISPLAY PANEL WITH COLOR ORGANIC LIGHT-TRANSMISSIVE THIN FILMS AND MANUFACTURING METHOD THEREOF

FIELD

The present disclosure relates to the field of display panel technologies, and more particularly, relates to a display panel and a manufacturing method thereof.

BACKGROUND

Organic light-emitting diode (OLED) display technologies have become increasingly mature. Relevant products have gradually evolved from a rigid structure to a flexible structure, and have even been developed to become rollable and retractable display products. The OLED display technologies diversify designs of display products and make them three-dimensional, which follow a trend toward light and thin body, low power consumption, and high reliability. It is necessary to address an issue about how to maximally reduce a thickness of display modules without affecting their display performance.

Nowadays, top-emitting structure designs are applied to OLED display products in the mobile display field to obtain high aperture and high color purity. However, the OLED display products with top-emitting structure designs also have strong reflectivity, reducing their usability under strong ambient light. Conventionally, to increase contrast, a polarizer needs to be disposed in the OLED display products. However, polarizers have disadvantages such as low transmittance, greater thickness, brittle texture, and high price, significantly limiting development of flexible OLED display technologies. To reduce reflectivity, some OLED display products are not provided with a polarizer. Specifically, the polarizer is replaced by a color filter which is directly formed on a thin-film encapsulation of OLEDs by low-temperature heating. Because color filters have extremely high transmittance, OLEDs can obtain exceptionally high brightness, and a thickness of OLEDs can be decreased from 100 μm to 5 μm. Nevertheless, compared with the polarizers, a surface of the color filters has relatively high reflectivity. As a result, the color filters have relatively low contrast under strong ambient light, making images difficult to be displayed outdoors.

SUMMARY

The present disclosure provides a display panel and a manufacturing method thereof. By forming a plurality of inorganic nanoparticles, which protrude from a surface of a plurality of organic light-transmissive thin films of an anti-reflective layer, to form a plurality of nano moth-eye structures, anti-reflective capability of the display panel can be improved, so that contrast of the display panel can be increased.

In a first aspect, the present disclosure provides a display panel, including a display device and an anti-reflective layer disposed on the display device; wherein the display device includes a plurality of sub-pixel areas distributed in an array manner.

The anti-reflective layer includes a plurality of organic light-transmissive thin films corresponding to the sub-pixel areas, a plurality of inorganic nanoparticles are doped in the organic light-transmissive thin films, and the inorganic nanoparticles positioned at a side of the organic light-transmissive thin films away from the display device protrude from a surface of the organic light-transmissive thin films to form a plurality of nano moth-eye structures.

In the display panel provided by the present disclosure, the anti-reflective layer further includes a plurality of light-shielding layers, a plurality of openings having a one-to-one correspondence relationship with the sub-pixel areas are formed on the light-shielding layers, and the organic light-transmissive thin films are disposed in the openings.

In the display panel provided by the present disclosure, the sub-pixel areas include a red sub-pixel area, a green sub-pixel area, and a blue sub-pixel area.

The organic light-transmissive thin film corresponding to the red sub-pixel area is a red color resist, the organic light-transmissive thin film corresponding to the green sub-pixel area is a green color resist, and the organic light-transmissive thin film corresponding to the blue sub-pixel area is a blue color resist.

In the display panel provided by the present disclosure, the organic light-transmissive thin films include one of a transparent color resist or a gray color resist.

In the display panel provided by the present disclosure, the organic light-transmissive thin film is further disposed on the light-shielding layers.

In the display panel provided by the present disclosure, a material of the inorganic nanoparticles includes silicon dioxide.

In the display panel provided by the present disclosure, a diameter of the inorganic nanoparticles ranges from 100 nm to 400 nm.

In the display panel provided by the present disclosure, a mass fraction of the inorganic nanoparticles in the organic light-transmissive thin films ranges from 5% to 15%.

In the display panel provided by the present disclosure, the display device includes a substrate, and a thin film transistor (TFT) array layer, a luminescent layer, and a thin film encapsulation layer which are sequentially disposed on the substrate, and the anti-reflective layer is disposed on a side of the thin film encapsulation layer away from the luminescent layer.

In the display panel provided by the present disclosure, the display device further includes a control function layer disposed between the thin film encapsulation layer and the anti-reflective layer.

In a second aspect, the present disclosure further provides a method of manufacturing a display panel, including following steps:

forming a display device, wherein the display device includes a plurality of sub-pixel areas distributed in an array manner;

forming an anti-reflective layer on the display device, wherein the anti-reflective layer includes a plurality of organic light-transmissive thin films corresponding to the sub-pixel areas, and a plurality of inorganic nanoparticles are doped in the organic light-transmissive thin films; and etching a side of the organic light-transmissive thin films away from the display device to remove part of the organic light-transmissive thin films, and exposing the inorganic nanoparticles at a side of the organic light-transmissive thin films away from the display device to form a plurality of nano moth-eye structures.

In the method provided by the present disclosure, in the step of etching a side of the organic light-transmissive thin films away from the display device, the method includes a following step:

etching the side of the organic light-transmissive thin films away from the display device by a plasma technology.

In the method provided by the present disclosure, the side of the organic light-transmissive thin films away from the display device is plasma etched with oxygen plasma and argon plasma.

In the method provided by the present disclosure, volume fractions of the oxygen plasma and the argon plasma range from 5% to 50%.

In the method provided by the present disclosure, the plasma etching is carried out with power ranging from 90 W to 400 W, etching time ranging from 60 s to 180 s, and pressure ranging from 10 Pa to 100 Pa.

In the method provided by the present disclosure, the anti-reflective layer further includes a plurality of light-shielding layers, and in the step of forming an anti-reflective layer on the display device, the method includes following steps:

forming the light-shielding layers on the display device, wherein a plurality of openings having a one-to-one correspondence relationship with the sub-pixel areas are formed on the light-shielding layers; and forming the organic light-transmissive thin films doped with the inorganic nanoparticles in the openings by an inkjet printing technology.

In the method provided by the present disclosure, the organic light-transmissive thin films include one of a transparent color resist or a gray color resist.

In the step of forming an anti-reflective layer on the display device, the method includes following steps:

forming the light-shielding layers on the display device, wherein a plurality of openings having a one-to-one correspondence relationship with the sub-pixel areas are formed on the light-shielding layers; and coating the organic light-transmissive thin films doped with the inorganic nanoparticles on an entire surface of the light-shielding layers and the openings.

In the method provided by the present disclosure, a material of the inorganic nanoparticles includes silicon dioxide.

In the method provided by the present disclosure, a diameter of the inorganic nanoparticles ranges from 100 nm to 400 nm.

In the method provided by the present disclosure, a mass fraction of the inorganic nanoparticles in the organic light-transmissive thin films ranges from 5% to 15%.

Regarding the beneficial effects: compared with conventional technologies, in an anti-reflective layer of a display panel provided by the present disclosure, a plurality of inorganic nanoparticles protrude from a surface of a plurality of organic light-transmissive thin films of an anti-reflective layer to form a plurality of nano moth-eye structures. Therefore, ambient incident light emitted on a surface of the display panel will be diffusely reflected by the nano moth-eye structures, and will not be emitted into human eyes. As a result, anti-reflective capability can be improved. In addition, the inorganic nanoparticles doped in the organic light-transmissive thin films can gather light, which is beneficial for enhancing transmittance of the display panel. Therefore, more light, which is used for display, in the display panel can be transmitted through the anti-reflective layer, and transmittance of the anti-reflective layer is increased. Furthermore, less ambient incident light is reflected by the anti-reflective layer, so that contrast of the display panel can be effectively increased.

DESCRIPTION OF DRAWINGS

Technical solutions and beneficial effects of the present disclosure are illustrated below in detail in conjunction with drawings and specific embodiments.

DETAILED DESCRIPTION

Figure 1:
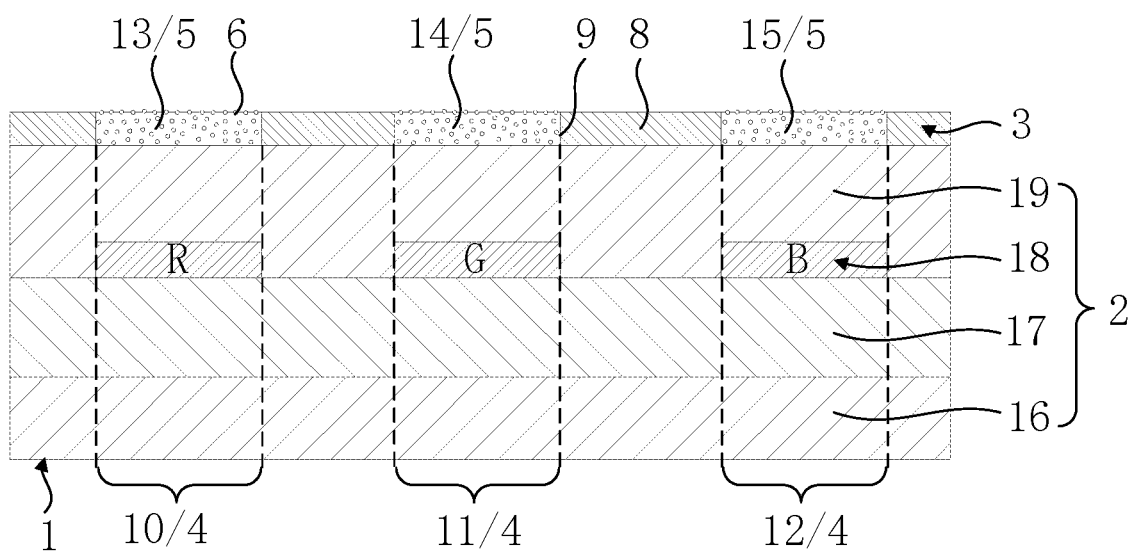
FIG. 1 is a sectional schematic view showing a portion of a structure of a display panel according to an embodiment of the present disclosure.

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on", "above", or "on top of" a second feature may include an embodiment in which the first feature is right "on", "above", or "on top of" the second feature and may also include an embodiment in which the first feature is not right "on," "above," or "on top of" the second feature, or just means that the first feature has a sea level elevation greater than the sea level elevation of the second feature. While first feature "beneath", "below", or "on bottom of" a second feature may include an embodiment in which the first feature is right "beneath", "below", or "on bottom of" the second feature and may also include an embodiment in which the first feature is not right "beneath", "below", or "on bottom of" the second feature"\, or just means that the first feature has a sea level elevation less than the sea level elevation of the second feature.

The disclosure below provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Top-emitting structures are applied to most of OLED display panels, resulting in a surface of the OLED display panels with relatively high reflectivity (even reaching 50%). As a result, when being used under strong ambient light, the OLED display panels have relatively low contrast and poor readability, severely affecting their display function. Typically, a solution is to attach a circular polarizer to a light-emitting side of the OLED display panels. Therefore, incident light and reflected light cancel each other because of interference, and contrast is increased. However, circular polarizers have disadvantages, such as greater thickness, low transmittance, and brittle texture, which are not beneficial for realizing flexible displays. To solve the above problem, embodiments provide a solution: replacing a polarizer with a color filter with relatively lesser thickness. Specifically, by utilizing self-luminescence characteristics of red, green, and blue sub-pixels, the color filter can be correspondingly disposed on the above three sub-pixels. Because red, green, and blue light respectively emitted from the red, green, and blue sub-pixels match with transmittance of the color filter corresponding to the above three sub-pixels, more red, green, and blue light can be transmitted through a display panel from an interior, and ambient natural light (white light) emitted on the color filter will be absorbed. Furthermore, a plurality of light-shielding layers with capability of absorbing ambient incident light, e.g., black matrix, covers non-luminescent areas, thereby reducing reflectivity of a surface of the display panel, and increasing contrast of the display panel.

Nevertheless, compared with the polarizers, a surface of the color filters has relatively high reflectivity. As a result, the color filters have relatively low contrast under strong ambient light, making images difficult to be displayed outdoors. To further increase contrast of display panels, the present disclosure provides embodiments demonstrating several display panels and manufacturing methods thereof.

Figure 2:
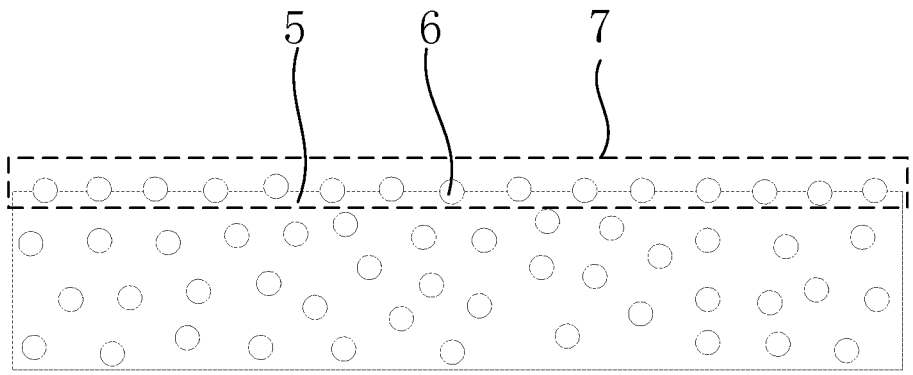
FIG. 2 is a sectional schematic view showing a portion of a structure of a plurality of organic light-transmissive thin films according to an embodiment of the present disclosure.

Specifically, as shown in FIG. 1 and FIG. 2, an embodiment of the present disclosure provides a display panel 1, including a display device 2 and an anti-reflective layer 3 disposed on the display device 2. The display device 2 includes a plurality of sub-pixel areas 4 distributed in an array manner. The anti-reflected layer 3 includes a plurality of organic light-transmissive thin films 5 corresponding to the sub-pixel areas 4. A plurality of inorganic nanoparticles 6 are doped in the organic light-transmissive thin films 5. The inorganic nanoparticles 6 at a side of the organic light-transmissive thin films 5 away from the display device 2 protrude from a surface of the organic light-transmissive thin films 5 to form a plurality of nano moth-eye structures 7.

Specifically, the anti-reflective layer 3 further includes a plurality of light-shielding layers 8. A plurality of openings 9 having a one-to-one correspondence relationship with the sub-pixel areas 4 are formed on the light-shielding layers 8, and the organic light-transmissive thin films 5 are disposed in the openings 9. The light-shield layers 8 may be a black matrix, but are not limited thereto. The light-shielding layers 8 can absorb ambient natural light and reduce reflectivity (enhancing an anti-reflective effect), and is beneficial for increasing contrast of the display panel 1.

Specifically, the organic light-transmissive thin films 5 doped with the inorganic particles 6 are printed in the openings 9 by lithography or inkjet printing.

Specifically, a material of the inorganic nanoparticles 6 includes silicon dioxide, a diameter of the inorganic nanoparticles 6 ranges from 100 nm to 400 nm, and a mass fraction of the inorganic nanoparticles 6 in the organic light-transmissive thin films 5 ranges from 5% to 15%.

Specifically, the surface of the organic light-transmissive thin films 5 doped with the inorganic nanoparticles 6 is etched by a plasma technology to form the above nano moth-eye structures. The surface of the organic light-transmissive thin films 5 is etched with oxygen plasma or argon plasma. Oxygen forms active oxygen atoms in a plasma state, and the oxygen atoms easily react with the organic light-transmissive thin films 5 having an organic material, thereby etching the organic light-transmissive thin films 5. Argon in a plasma state can physically bombard the surface of the organic light-transmissive thin films 5. The above two elements can etch the organic light-transmissive thin films 5 without etching the inorganic nanoparticles 6 having an inorganic material. The inorganic nanoparticles 6 are exposed after a portion of the surface of the organic light-transmissive thin films 5 is etched, thereby forming the nano moth-eye structures.

Specifically, the sub-pixel areas 4 include a red sub-pixel area 10, a green sub-pixel area 11, and a blue sub-pixel area 12. The organic light-transmissive thin film 5 corresponding to the red sub-pixel area 10 is a red color resist 13, the organic light-transmissive thin film 5 corresponding to the green sub-pixel area 11 is a green color resist 14, and the organic light-transmissive thin film 5 corresponding to the blue sub-pixel area 12 is a blue color resist 15. The red color resist 13, the green color resist 14, and the blue color resist 15 not only can increase transmittance of red, green, and blue light in the display panel 1, but also can absorb ambient incident light to improve anti-reflective effect, thereby increasing contrast of the display panel 1.

Specifically, the display device 2 includes a substrate 16, and a thin-film transistor (TFT) array layer 17, a luminescent layer 18, and a thin film encapsulation layer 19 which are sequentially disposed on the substrate 16. The anti-reflective layer 3 is disposed on a side of the thin film encapsulation layer 19 away from the luminescent layer 18.

Figure 3:
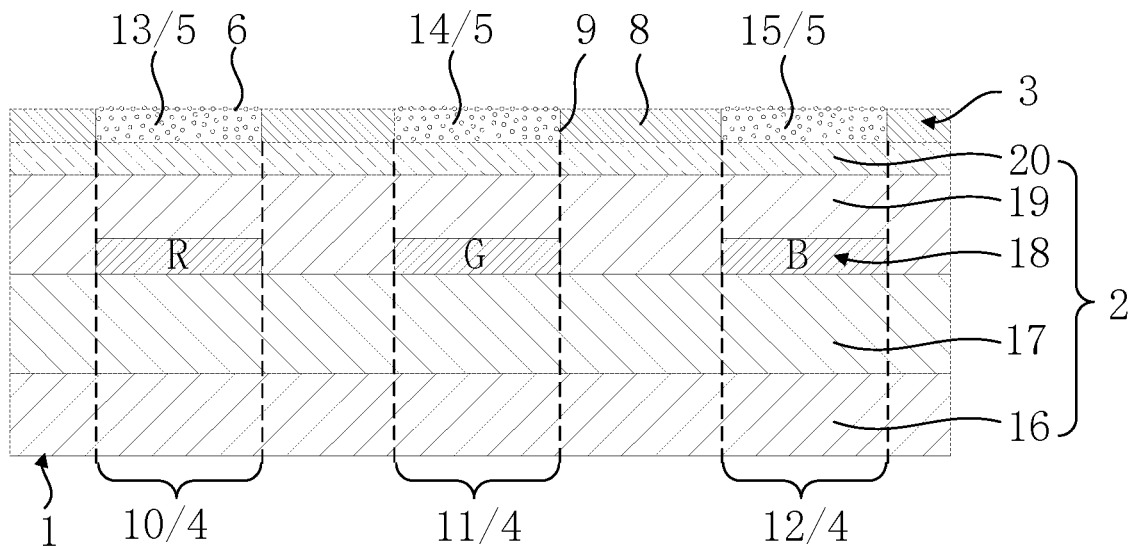
FIG. 3 is a sectional schematic view showing a portion of a structure of another display panel according to an embodiment of the present disclosure.

Of course, as shown in FIG. 3, in the display device 2, a control function layer 20 may further be disposed between the thin film encapsulation layer 19 and the anti-reflective layer 3, thereby realizing a control function.

Specifically, the display device 2 may be an OLED display device, a quantum dot light-emitting diode (QLED) display device, or a micro LED display device, which is not limited here. If the display device 2 is the OLED display device, it may display images with red, green, and blue light, or may display images with white light combined with a color filter.

In the present embodiment, the inorganic nanoparticles 6 protrude from the surface of the organic light-transmissive thin films 5 of the anti-reflective layer 3 to form the nano moth-eye structures. Therefore, ambient incident light emitted on a surface of the display panel 1 will be diffusely reflected by the nano moth-eye structures, and will not be emitted into human eyes. As a result, an anti-reflective effect can be improved, which means that reflectivity is reduced. In addition, the inorganic nanoparticles 6 doped in the organic light-transmissive thin films 5 can gather light, which is beneficial for enhancing light transmittance of the display panel 1. Furthermore, the light-shielding layers 8 of the anti-reflective layer 3 can absorb ambient natural light to reduce reflectivity. The organic light-transmissive thin films 5 are the red color resist 13, the green color resist 14, and the blue color resist 15, which respectively correspond to the red sub-pixel area 10, the green sub-pixel area 11, and the blue sub-pixel area 12. The organic light-transmissive thin films 5 not only can increase transmittance of red, green, and blue light in the display panel 1, but also can absorb ambient incident light to improve anti-reflective effect, thereby increasing contrast of the display panel 1. In summary, more light, which is used for display, in the display panel 1 can be transmitted through the anti-reflective layer 3, so that transmittance of the anti-reflective layer 3 is increased. Moreover, less ambient incident light is reflected by the anti-reflective layer 3, so that contrast of the display panel 1 can be effectively increased.

Figure 4:
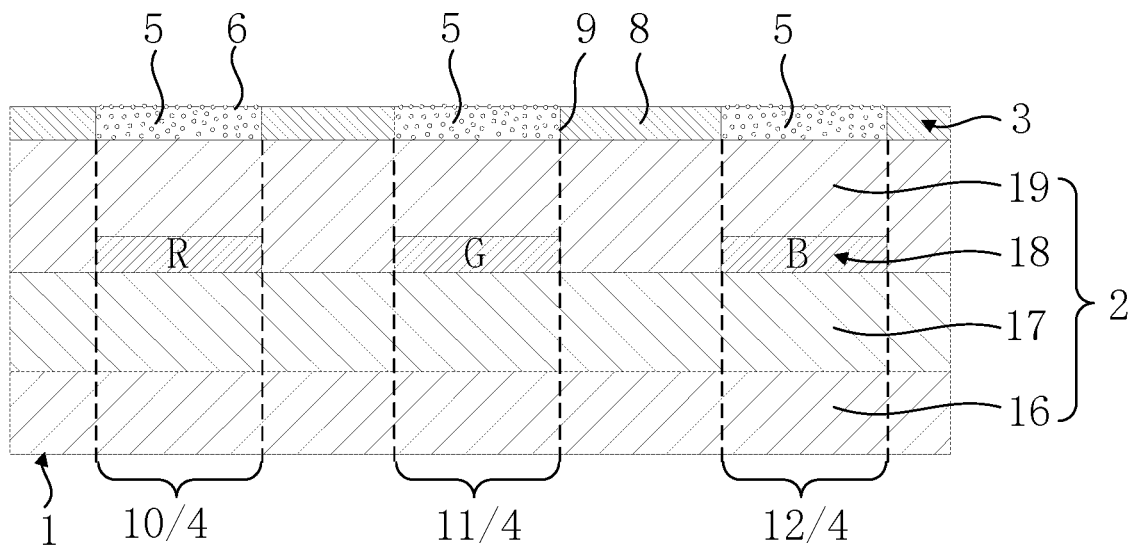
FIG. 4 is a sectional schematic view showing a portion of a structure of yet another display panel according to an embodiment of the present disclosure.

As shown in FIG. 2 and FIG. 4, an embodiment of the present disclosure further provides a display panel. Different from the above embodiment, the organic light-transmissive thin films 5 of the present embodiment include one of a transparent color resist or a gray color resist. In other words, the organic light-transmissive thin films 5 corresponding to each of the sub-pixels are the transparent color resists or the gray color resists.

Specifically, the organic light-transmissive thin films 5 in the entire anti-reflective layer 3 can be manufactured with only one mask. Of course, the organic light-transmissive thin films 5 may also be formed by inkjet printing, which is not limited here.

In the present embodiment, the inorganic nanoparticles 6 protrude from the surface of the organic light-transmissive thin films 5 of the anti-reflective layer 3 to form the nano moth-eye structures. Therefore, ambient incident light emitted on the surface of the display panel 1 will be diffusely reflected by the nano moth-eye structures, and will not be emitted into human eyes. As a result, an anti-reflective effect can be improved, which means that reflectivity is reduced. In addition, the inorganic nanoparticles 6 doped in the organic light-transmissive thin films 5 can gather light, which is beneficial for enhancing light transmittance of the display panel 1. Furthermore, the light-shielding layers 8 of the anti-reflective layer 3 can absorb ambient natural light to reduce reflectivity. In summary, more light, which is used for display, in the display panel 1 can be transmitted through the anti-reflective layer 3, so that transmittance of the anti-reflective layer 3 is increased. Moreover, less ambient incident light is reflected by the anti-reflective layer 3, so that contrast of the display panel 1 can be effectively increased. In addition, the organic light-transmissive thin films 5 of the present embodiment are the transparent color resists or the gray color resists. If the organic light-transmissive thin films 5 are manufactured by lithography, only one mask needs to be used in the manufacturing process. Compared with a manufacturing process using three masks to form the organic light-transmissive thin films 5 including the red color resist 13, the green color resist 14, and the blue color resist 15, the manufacturing process provided by the present embodiment can omit two masks, thereby simplifying manufacturing procedures and reducing costs.

Figure 5:
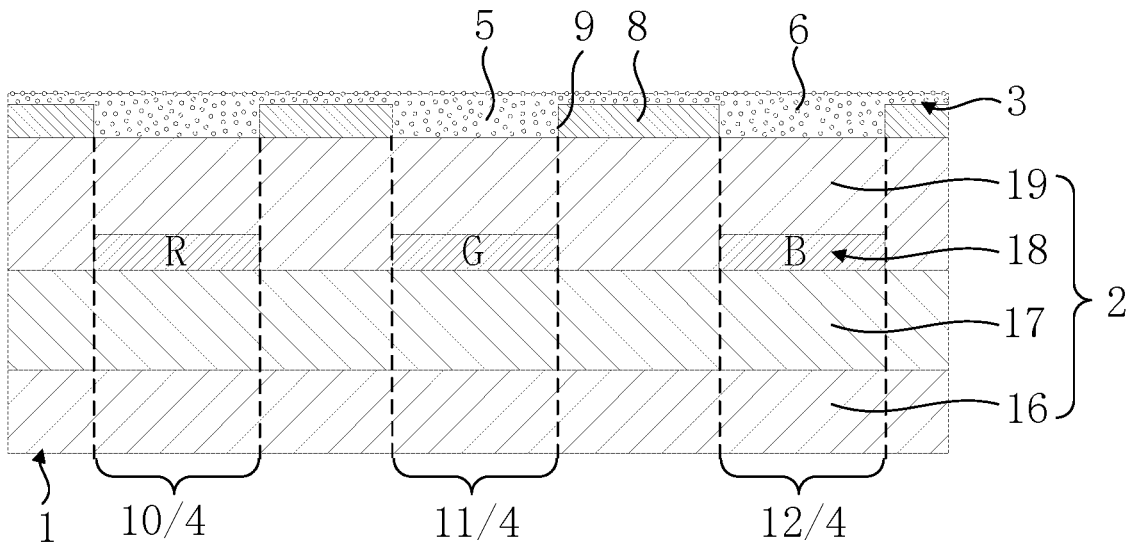
FIG. 5 is a sectional schematic view showing a portion of a structure of yet another display panel according to an embodiment of the present disclosure.

As shown in FIG. 2 and FIG. 5, an embodiment of the present disclosure further provides a display panel 1. Different from the above embodiments, in the present embodiment, the organic light-transmissive thin films 5 are further disposed on the light-shielding layers 8.

Specifically, the organic light-transmissive thin films 5 include one of the transparent color resist or the gray color resist and cover the light-shielding layers 8 and the openings 9. Correspondingly, the nano moth-eye structure 7 also corresponds to the light-shielding layers 8. In other words, the nano moth-eye structure 7 is formed on an entire surface of the anti-reflective layer 3.

Specifically, in the present embodiment, the organic light-transmissive thin films 5 can be coated on an entire surface of the light-shielding layers 8 having openings 9 without using a mask.

In the present embodiment, the nano moth-eye structure 7 is formed on the entire surface of the anti-reflective layer 3, which makes incident light emitted on any position of the display panel 1 be diffusely reflected by the nano moth-eye structure, and prevents the incident light from entering human eyes. Therefore, reflectivity can be comprehensively reduced. Furthermore, the light-shielding layers 8 under the nano moth-eye structure can absorb ambient incident light, which further reduces reflectivity and is beneficial for increasing contrast of the display panel 1. In addition, the organic light-transmissive thin films 5 may be coated on the entire surface, thereby preventing the use of inkjet printing and lithography, and significantly reducing manufacturing difficulties and manufacturing costs.

Figure 6:
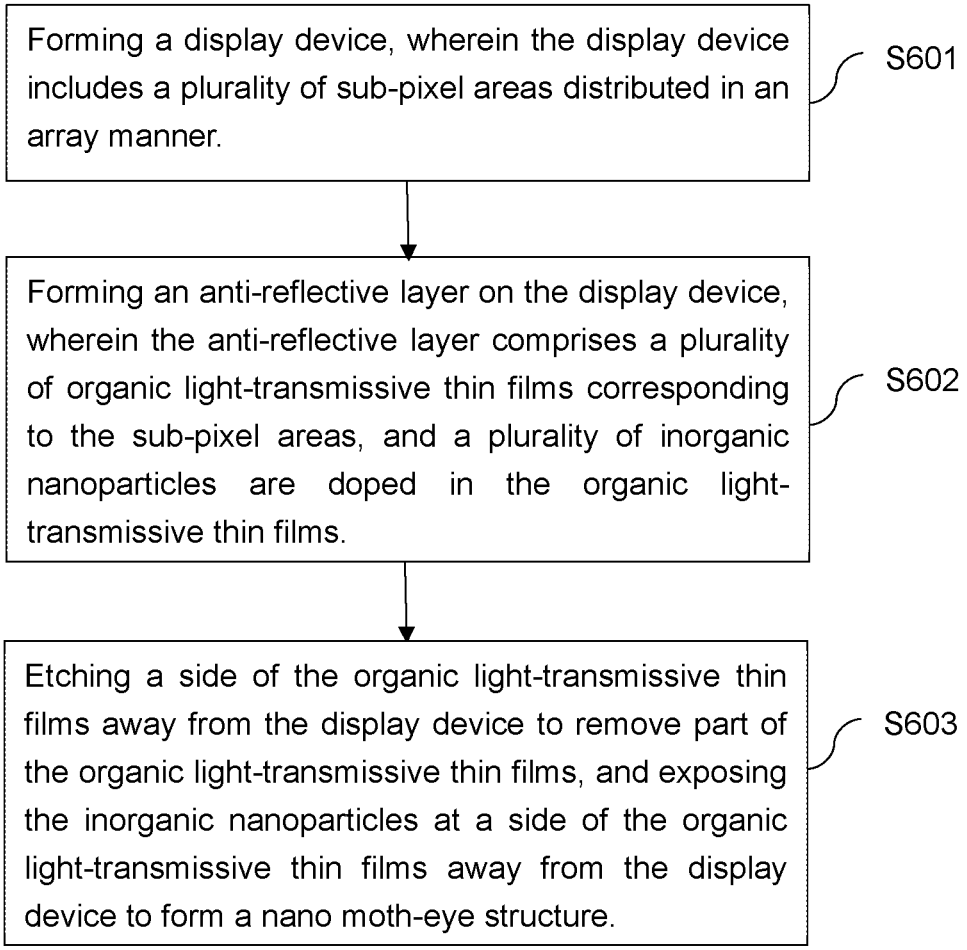
FIG. 6 is a schematic flowchart showing a method of manufacturing a display panel according to an embodiment of the present disclosure.

As shown in FIG. 6, an embodiment of the present disclosure further provides a method of manufacturing a display panel, including steps S601 to S603.

S601: forming a display device, wherein the display device includes a plurality of sub-pixel areas distributed in an array manner;

Specifically, as shown in FIG. 1, a display device 2 includes a substrate 16, and a thin-film transistor (TFT) array layer 17, a luminescent layer 18, and a thin film encapsulation layer 19 which are sequentially disposed on the substrate 16. The anti-reflective layer 3 is disposed on a side of the thin film encapsulation layer 19 away from the luminescent layer 18. Of course, as shown in FIG. 3, a function control layer 20 can be further disposed between the thin film encapsulation layer 19 and the anti-reflective layer 3.

Specifically, the display device 2 may be an OLED display device, a quantum dot light-emitting diode (QLED) display device, or a micro LED display device, which is not limited here. If the display device 2 is the OLED display device, it may display images with red, green, and blue light, or may display images with white light combined with a color filter.

S602: forming an anti-reflective layer on the display device, wherein the anti-reflective layer includes a plurality of organic light-transmissive thin films corresponding to the sub-pixel areas, and a plurality of inorganic nanoparticles are doped in the organic light-transmissive thin films.

Specifically, as shown in FIG. 1, the anti-reflective layer 3 further includes a plurality of light-shielding layers 8. The light-shielding layers 8 may be a black matrix, but is not limited thereto. The step S602 includes following steps:

forming the light-shielding layers 8 on the display device 2, wherein a plurality of openings 9 having a one-to-one correspondence relationship with the sub-pixel areas 4 are formed on the light-shielding layers 8; and forming the organic light-transmissive thin films 5 doped with the inorganic nanoparticles 6 in the openings 9 by an inkjet printing technology.

Specifically, a material of the inorganic nanoparticles 6 includes silicon dioxide, a diameter of the inorganic nanoparticles 6 ranges from 100 nm to 400 nm, and a mass fraction of the inorganic nanoparticles 6 in the organic light-transmissive thin films 5 ranges from 5% to 15%.

S603: etching a side of the organic light-transmissive thin films away from the display device to remove part of the organic light-transmissive thin films, and exposing the inorganic nanoparticles at a side of the organic light-transmissive thin films away from the display device to form a plurality of nano moth-eye structures.

Specifically, etching the side of the organic light-transmissive thin films away from the display device by a plasma technology. Oxygen forms active oxygen atoms in a plasma state, and the oxygen atoms easily react with the organic light-transmissive thin films having an organic material, thereby etching the organic light-transmissive thin films. Argon in a plasma state can physically bombard the surface of the organic light-transmissive thin films. The above two elements can etch the organic light-transmissive thin films without etching the inorganic nanoparticles having an inorganic material. The inorganic nanoparticles are exposed after part of the surface of the organic light-transmissive thin films is etched, thereby forming the nano moth-eye structures. In one embodiment, volume fractions of the oxygen plasma and the argon plasma range from 5% to 50%. The plasma etching is carried out with power ranging from 90 W to 400 W, etching time ranging from 60 s to 180 s, and pressure ranging from 10 Pa to 100 Pa.

In the present embodiment, the inorganic nanoparticles protrude from the surface of organic light-transmissive thin films of the anti-reflective layer to form the nano moth-eye structures. Therefore, ambient light emitted on a surface of the display panel will be diffusely reflected by the nano moth-eye structures, and will not be emitted into human eyes. As a result, anti-reflective capability can be improved. In addition, the inorganic nanoparticles doped in the organic light-transmissive thin films can gather light, which is beneficial for enhancing light transmittance of the display panel. Therefore, more light, which is used for display, in the display panel can be transmitted through the anti-reflective layer, so that transmittance of the anti-reflective layer is increased. Furthermore, less ambient incident light is reflected by the anti-reflective layer, so that contrast of the display panel can be effectively increased.

In one embodiment, as shown in FIG. 1, the sub-pixel areas 4 include a red sub-pixel area 10, a green sub-pixel area 11, and a blue sub-pixel area 12. The organic light-transmissive thin film 5 corresponding to the red sub-pixel area 10 is a red color resist 13, the organic light-transmissive thin film 5 corresponding to the green sub-pixel area 11 is a green color resist 14, and the organic light-transmissive thin film 5 corresponding to the blue sub-pixel area 12 is a blue color resist 15.

In the present embodiment, the red color resist 13, the green color resist 14, and the blue color resist 15 not only can increase transmittance of red, green, and blue light in the display panel 1, but also can absorb ambient incident light to improve anti-reflective effect, thereby increasing contrast of the display panel 1.

An embodiment of the present disclosure further provides a method of manufacturing a display panel. Different from the above embodiment, in the present embodiment, the organic light-transmissive thin films include one of a transparent color resist or a gray color resist, and the S602 includes following steps:

forming the light-shielding layers on the display device, wherein a plurality of openings having a one-to-one correspondence relationship with the sub-pixel areas are formed on the light-shielding layers; and coating the organic light-transmissive thin films doped with the inorganic nanoparticles on an entire surface of the light-shielding layers and the openings.

In the present embodiment, the nano moth-eye structure is formed on the entire surface of the anti-reflective layer, which makes incident light emitted on any position of the display panel be diffusely reflected by the nano moth-eye structure, and prevents the incident light from entering human eyes. Therefore, reflectivity can be comprehensively reduced. Furthermore, the light-shielding layers under the nano moth-eye structure can absorb ambient incident light, which further reduces reflectivity and is beneficial for increasing contrast of the display panel. In addition, the organic light-transmissive thin films are coated on the entire surface, thereby preventing the use of inkjet printing and lithography, and significantly reducing manufacturing difficulties and manufacturing costs.

In the above embodiments, the focus of each embodiment is different, and for a part that is not detailed in an embodiment, reference may be made to related descriptions of other embodiments.

A display panel and a manufacturing thereof have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display panel, comprising a display device and an anti-reflective layer disposed on the display device;
   wherein the display device comprises a plurality of sub-pixel areas distributed in an array manner; and
   the anti-reflective layer comprises a plurality of organic light-transmissive thin films corresponding to the sub-pixel areas, a plurality of inorganic nanoparticles are doped in the organic light-transmissive thin films, and the inorganic nanoparticles positioned at a side of the organic light-transmissive thin films away from the display device protrude from a surface of the organic light-transmissive thin films to form a plurality of nano moth-eye structures;

wherein the anti-reflective layer further comprises a plurality of light-shielding layers, a plurality of openings having a one-to-one correspondence relationship with the sub-pixel areas are formed on the light-shielding layers, and the organic light-transmissive thin films are disposed in the openings;

wherein the sub-pixel areas comprise a red sub-pixel area, a green sub-pixel area, and a blue sub-pixel area; and the organic light-transmissive thin film corresponding to the red sub-pixel area is a red color resist, the organic light-transmissive thin film corresponding to the green sub-pixel area is a green color resist, and the organic light-transmissive thin film corresponding to the blue sub-pixel area is blue color resist.

2. The display panel of claim 1, wherein a material of the inorganic nanoparticles comprises silicon dioxide.

3. The display panel of claim 2, wherein a diameter of the inorganic nanoparticles ranges from 100 nm to 400 nm.

4. The display panel of claim 1, wherein a mass fraction of the inorganic nanoparticles in the organic light-transmissive thin films ranges from 5% to 15%.

5. The display panel of claim 1, wherein the display device comprises a substrate, and a thin film transistor (TFT) array layer, a luminescent layer, and a thin film encapsulation layer which are sequentially disposed on the substrate, and the anti-reflective layer is disposed on a side of the thin film encapsulation layer away from the luminescent layer.

6. The display panel of claim 5, wherein the display device further comprises a control function layer disposed between the thin film encapsulation layer and the anti-reflective layer.

7. A method of manufacturing a display panel, comprising following steps:
forming a display device, wherein the display device comprises a plurality of sub-pixel areas distributed in an array manner;
forming an anti-reflective layer on the display device, wherein the anti-reflective layer comprises a plurality of organic light-transmissive thin films corresponding to the sub-pixel areas, and a plurality of inorganic nanoparticles are doped in the organic light-transmissive thin films;
etching a side of the organic light-transmissive thin films away from the display device to remove part of the organic light-transmissive thin films, and
exposing the inorganic nanoparticles at the side of the organic light-transmissive thin films away from the display device to form a plurality of nano moth-eye structures.

8. The method of claim 7, wherein in the step of etching the side of the organic light-transmissive thin films away from the display device, the method comprises a following step:
etching the side of the organic light-transmissive thin films away from the display device by a plasma technology.

9. The method of claim 8, wherein the side of the organic light-transmissive thin films away from the display device is plasma etched with oxygen plasma and argon plasma.

10. The method of claim 9, wherein volume fractions of the oxygen plasma and the argon plasma range from 5% to 50%.

11. The method of claim 10, wherein the plasma etching is carried out with power ranging from 90 W to 400 W, etching time ranging from 60 s to 180 s, and pressure ranging from 10 Pa to 100 Pa.

12. The method of claim 7, wherein the anti-reflective layer further comprises a plurality of light-shielding layers, and in the step of forming the anti-reflective layer on the display device, the method comprises following steps:
forming the light-shielding layers on the display device, wherein a plurality of openings having a one-to-one correspondence relationship with the sub-pixel areas are formed on the light-shielding layers; and
forming the organic light-transmissive thin films doped with the inorganic nanoparticles in the openings by an inkjet printing technology.

13. The method of claim 7, wherein the anti-reflective layer further comprises a plurality of light-shielding layers, and the organic light-transmissive thin films comprise one of a transparent color resist or a gray color resist; and
in the step of forming the anti-reflective layer on the display device, the method comprises following steps:
forming the light-shielding layers on the display device, wherein a plurality of openings having a one-to-one correspondence relationship with the sub-pixel areas are formed on the light-shielding layers; and
coating the organic light-transmissive thin films doped with the inorganic nanoparticles on an entire surface of the light-shielding layers and the openings.

14. The method of claim 7, wherein a material of the inorganic nanoparticles comprises silicon dioxide.

15. The method of claim 14, wherein a diameter of the inorganic nanoparticles ranges from 100 nm to 400 nm.

16. The method of claim 7, wherein a mass fraction of the inorganic nanoparticles in the organic light-transmissive thin films ranges from 5% to 15%.

17. A display panel, comprising a display device and an anti-reflective layer disposed on the display device;
wherein the display device comprises a plurality of sub-pixel areas distributed in an array manner; and
the anti-reflective layer comprises a plurality of organic light-transmissive thin films corresponding to the sub-pixel areas, a plurality of inorganic nanoparticles are doped in the organic light-transmissive thin films, and the inorganic nanoparticles positioned at a side of the organic light-transmissive thin films away from the display device protrude from a surface of the organic light-transmissive thin films to form a plurality of nano moth-eye structures;
wherein the anti-reflective layer further comprises a plurality of light-shielding layers, a plurality of openings having a one-to-one correspondence relationship with the sub-pixel areas are formed on the light-shielding layers, and the organic light-transmissive thin films are disposed in the openings;
wherein the organic light-transmissive thin films comprise one of a transparent color resist or a gray color resist.

18. The display panel of claim 17, wherein the organic light-transmissive thin films are further disposed on the light-shielding layers.

19. The display panel of claim 17, wherein a material of the inorganic nanoparticles comprises silicon dioxide.

20. The display panel of claim 19, wherein a diameter of the inorganic nanoparticles ranges from 100 nm to 400 nm.

\* \* \* \* \*